United States Patent [19]

Eisenblätter et al.

[11] Patent Number: 4,764,847
[45] Date of Patent: Aug. 16, 1988

[54] SUPPORT PLATE FOR ELECTRONIC COMPONENTS

[75] Inventors: Axel Eisenblätter, Mainz; Gerhard Sonnack, Wachtberg; Günter Hörning, Kelkheim, all of Fed. Rep. of Germany

[73] Assignee: VDO Adolf Schindling AG, Frankfurt am Main, Fed. Rep. of Germany

[21] Appl. No.: 936,476

[22] Filed: Nov. 26, 1986

[30] Foreign Application Priority Data

Dec. 4, 1985 [DE] Fed. Rep. of Germany ....... 3542914
Oct. 3, 1986 [DE] Fed. Rep. of Germany ....... 3633625

[51] Int. Cl.⁴ .............................................. H05K 7/20
[52] U.S. Cl. .................... 361/388; 165/80.3; 165/185; 357/79; 357/81; 361/386; 361/417; 361/420
[58] Field of Search ...................... 165/80.1, 80.3, 185; 174/16 HS; 357/79, 81; 361/386–389, 400, 401, 417–420

[56] References Cited

U.S. PATENT DOCUMENTS

| | | | |
|---|---|---|---|
| 2,541,828 | 2/1951 | Peck .................................. | 165/80.3 |
| 4,100,589 | 7/1978 | McGann ............................. | 361/418 |
| 4,224,663 | 9/1980 | Maiese et al. ..................... | 361/388 |
| 4,314,220 | 2/1982 | Ito et al. ............................ | 361/419 |
| 4,398,208 | 8/1983 | Murano et al. ..................... | 357/81 |
| 4,587,377 | 5/1986 | Rodseth ............................. | 361/388 |
| 4,605,986 | 8/1986 | Bentz et al. ....................... | 361/387 |
| 4,613,925 | 9/1986 | Mohri et al. ....................... | 361/420 |
| 4,646,203 | 2/1987 | Ngo et al. .......................... | 361/388 |

FOREIGN PATENT DOCUMENTS 3614086 10/1986 Fed. Rep. of Germany ........ 357/81

OTHER PUBLICATIONS

Cimijotti, "Mounting Clamp for Electronic Components", IBM Technical Disclosure Bulletin, vol. 22, No. 3, 8/79, p. 1145.

*Primary Examiner*—Roy N. Envall, Jr.
*Assistant Examiner*—Gregory D. Thompson
*Attorney, Agent, or Firm*—Martin A. Farber

[57] ABSTRACT

A support plate of metal has at least one receiving depression into which an electronic component having a base of copper is inserted. The component is held by holding parts which are extended upward on the outside on the base and engage by bends over the base.

18 Claims, 7 Drawing Sheets

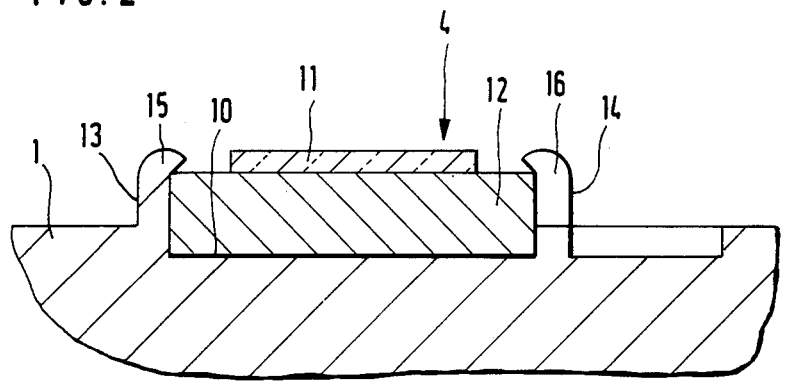
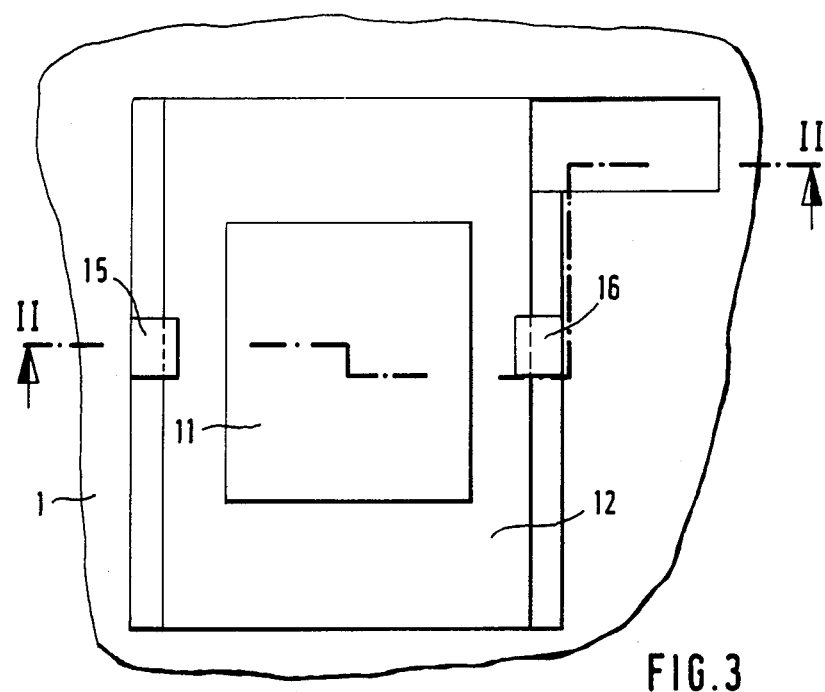

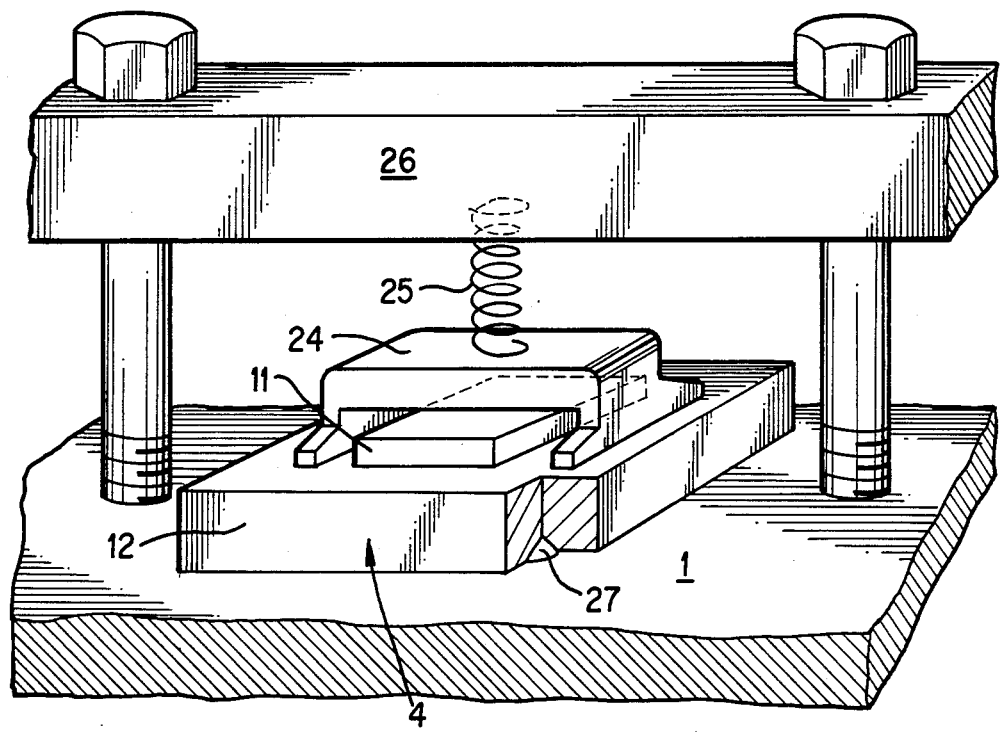
FIG. 6
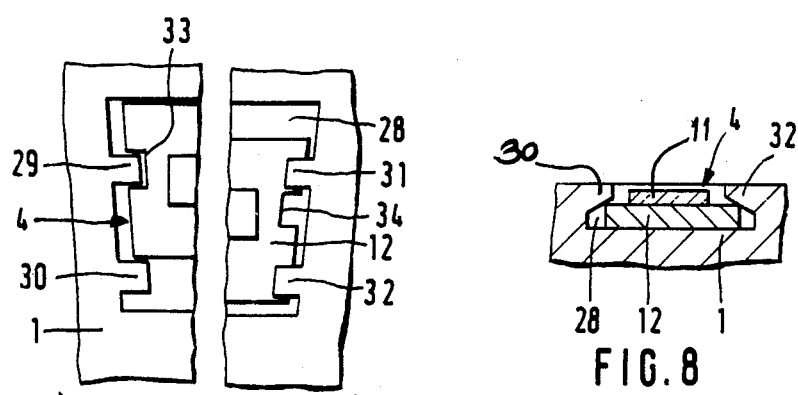
FIG. 7
FIG. 8

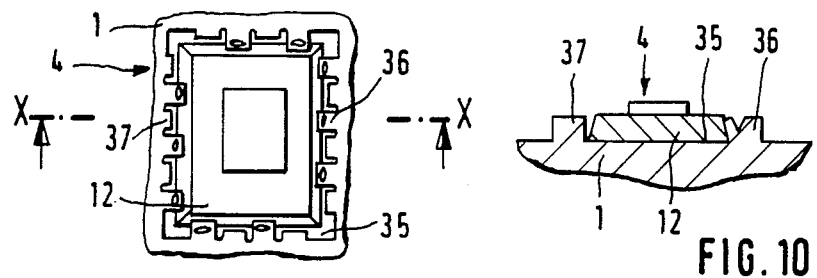
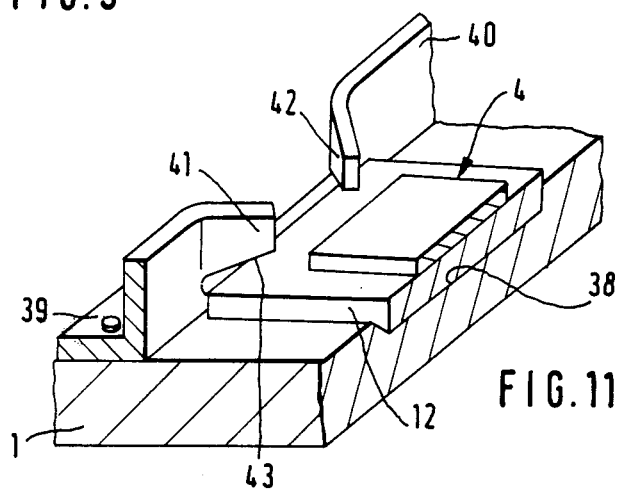
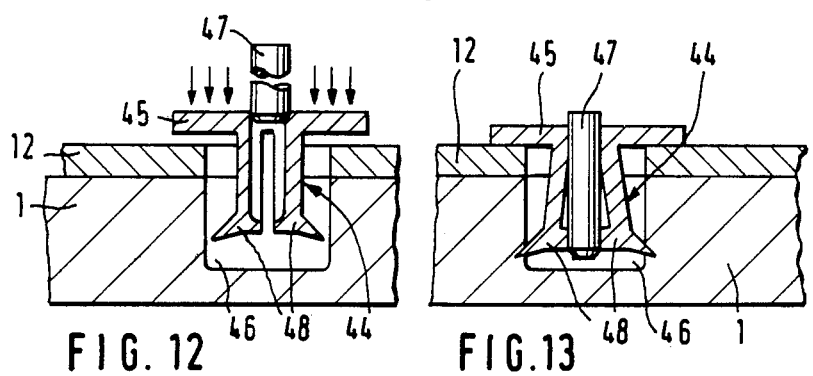

4,764,847

SUPPORT PLATE FOR ELECTRONIC COMPONENTS

FIELD AND BACKGROUND OF THE INVENTION

The present invention relates to a support plate of metal on which a plurality of electronic components, particularly integrated circuits, each of which has a metal base, are placed and held. Such support plates are used generally for the construction of electronic circuits and are therefore known.

Ordinarily, the support plates consist of aluminum and the bases consist of copper. The electronic components having the copper bases are seated on the support plates so that heat produced in the electronic components can be suitably lead away by the support plates. With the known support plates, the bases of the electronic components are soldered onto them. For this purpose, the support plates must be nickel-plated.

The electronic components on the support plates are connected to other electronic components. The testing of the components is possible only after they have been completely mounted. If a component then proves to be defective, it must be replaced. For this purpose it must be unsoldered, which requires a considerable application of heat due to the solder connection of the base to the support plate. This causes the result that adjacent electronic components also become unsoldered and thereby become unusable. Therefore replacement of individual electronic components for repair purposes becomes impossible.

SUMMARY OF THE INVENTION

The object of the present invention is to develop a support plate of the aforementioned type in such a manner that even after a complete mounting of all the components, individual components can be replaced without adjacent components being thereby damaged.

This object is achieved in accordance with the invention in the manner that the bases of the electronic components are held detachably on the support plate by holding parts of the support plate which grip in part over the bases.

Accordingly, one dispenses with the soldering of the bases of the electronic components onto the support plate. In this way, after the electronic components have been mounted, they can be removed from the support plate without the application of heat. This permits a replacement of individual components when the components, upon the testing of a circuit, prove defective or when they become defective over the course of time. Due to the invention, the manufacture and repair of electronic circuits becomes less expensive.

The heat flowing from the electronic components into the bases can be conducted particularly well into the support plates if the bases of the electronic components are inserted in receiving depressions in the support plate. Furthermore, the bases are additionally secured in these receiving depressions against lateral displacement.

The receiving depressions can be produced in particularly economic manner by molding.

The bases are held in particularly simple manner on the support plate or in the receiving depressions present in it if, in accordance with an advantageous aspect of the invention, the holding parts are formed by webs which extend out of the plane of the support plate and each of which grips in part over the bases by means of at least one bend.

Electronic components of different width can be inserted into receiving depressions of a standard width if the receiving depressions are wider than the bases, and if there is inserted in the depressions at least one holding part which has a web which extends out of the plane of a support plate.

The electronic components are particularly easily replaceable if the holding parts are spring elements which are inserted into the support plate and extend in part over at least one base by a resilient spring arm.

Further reduction in the cost of manufacture of electronic circuits is attained, in accordance with another embodiment of the invention, by forming the spring elements into spring arms pointing in opposite directions for the holding of two bases each.

The contact of the bases of the electronic components with the support plate can be improved by providing a heat-conductive paste between the bases and the support plate. In this way, the resistance to heat transfer between the bases and the support plate is reduced.

Further advantageous embodiments are set forth hereinafter. Their specific advantages will become evident from the following description of the figures.

BRIEF DESCRIPTION OF THE DRAWING

The invention permits of numerous embodiments. For the further clarification of its basic principle, several of these embodiments are shown in the drawing and will be described below. In the drawing.

FIG. 2 is a section through the support plate in the region of an electronic component, the section being taken along a line II—II in FIG. 3;

FIG. 3 is a top view of the arrangement of FIG. 2;

FIG. 6 is a perspective view of another embodiment of a support plate bearing an electronic component;

FIG. 7 is a top view of another embodiment of a support plate bearing an electronic component;

FIG. 8 is a section through the arrangement of FIG. 7;

FIG. 9 is a top view of another embodiment of a support plate bearing an electronic component;

FIG. 10 is a section through the arrangement of FIG. 9;

FIG. 11 is a perspective view of another embodiment of a support plate bearing an electronic component;

FIG. 12 is a section through a support plate bearing an electronic component which is not yet fastened to it;

FIG. 13 is a showing corresponding to FIG. 12 with the electronic component fastened;

DETAILED DESCRIPTION OF THE PREFERRED EMBODIMENTS

Figure 1:
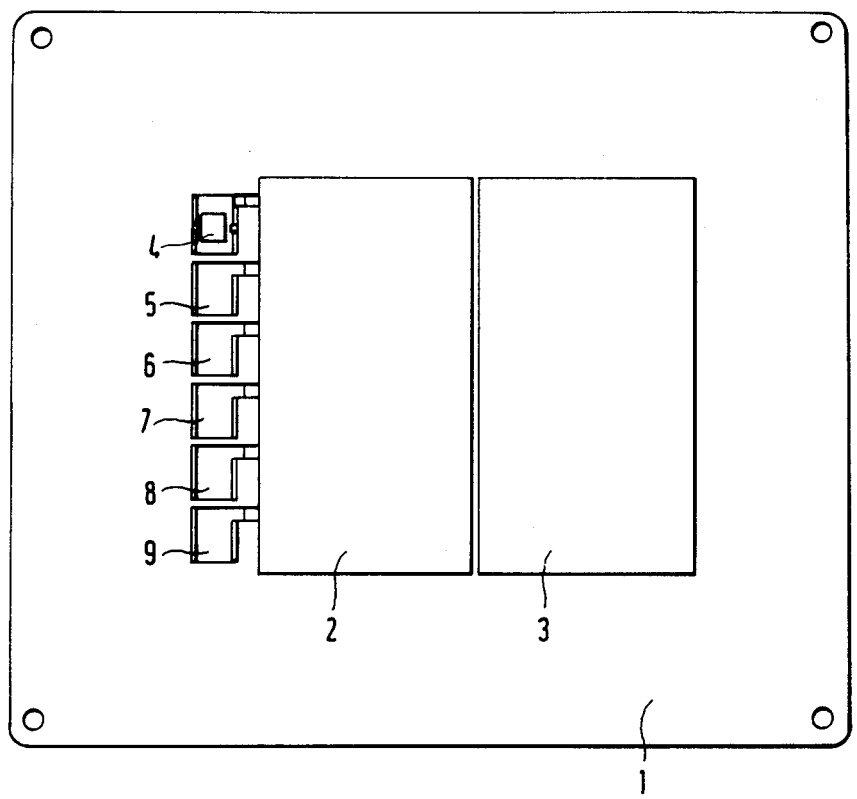
FIG. 1 is a diagrammatic top view of a support plate, developed according to the invention, bearing electronic components.

FIG. 1 shows a support plate, which ordinarily consists of aluminum to be of good thermal conductivity. Two circuit hybrids 2, 3 are arranged on this support plate. To the left of these hybrids 2, 3 in the drawing there are six electronic components, of which only one component 4 is shown. These components 4 are power IC's. Below the electronic component 4 there are shown, alongside of each other, five receiving depressions 5-19 which serve to receive the electronic components. The electronic components 4 are wired to the hybrid 2 and to other components by wiring, not shown.

FIG. 2 shows a partial region of the support plate 1. It has a receiving depression 10 within which the electronic component 4 is seated. This electronic component consists of a chip 11 which is applied on a base 12 of copper. This base 12 is seated firmly in the receiving depression 10. On both longitudinal sides of the base 12, holding parts 13, 14 are provided which extend upwards on the longitudinal sides of the base 12, and each of which holding parts engages with a bend 15, 16 in part over the base 12.

FIG. 3 shows that these bends 15, 16 are relatively narrow and do not extend over the entire length of the base 12.

The receiving depression 10 is preferably produced by molding. In this case the holding parts 13 and 14 are formed as an integral unit with the support plate 1.

Figure 4:
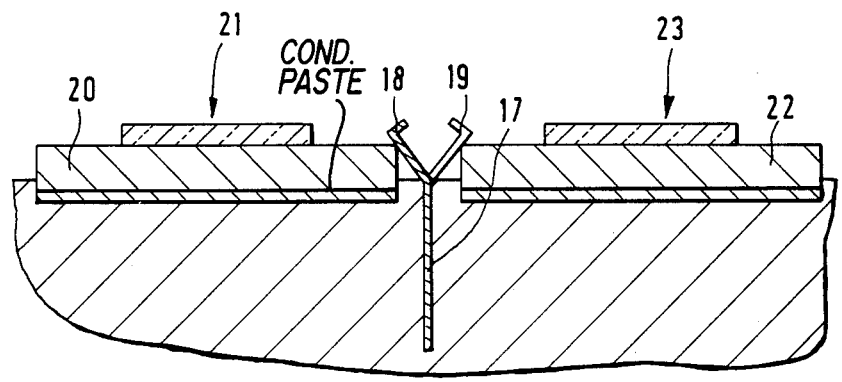
FIG. 4 is a sectional view taken along the line IV—IV of FIG. 5 through a second embodiment of a support plate bearing two electronic components.
Figure 5:
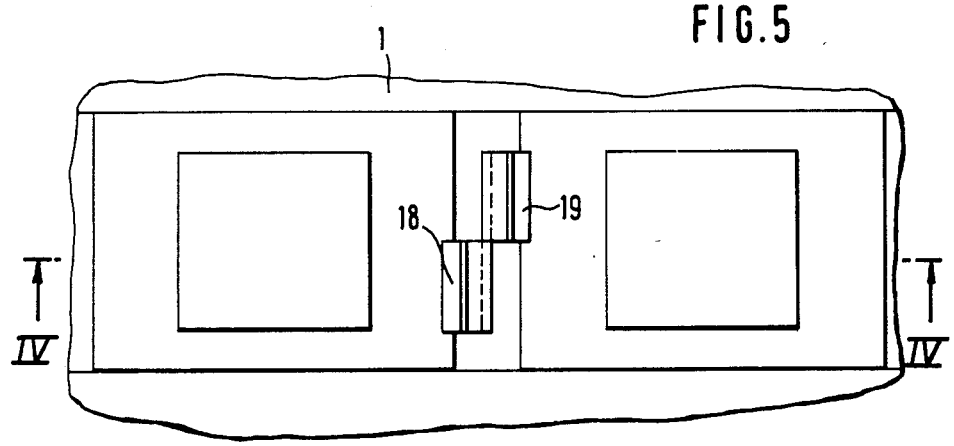
FIG. 5 is a top view of the arrangement of FIG. 4.
Figure 14:
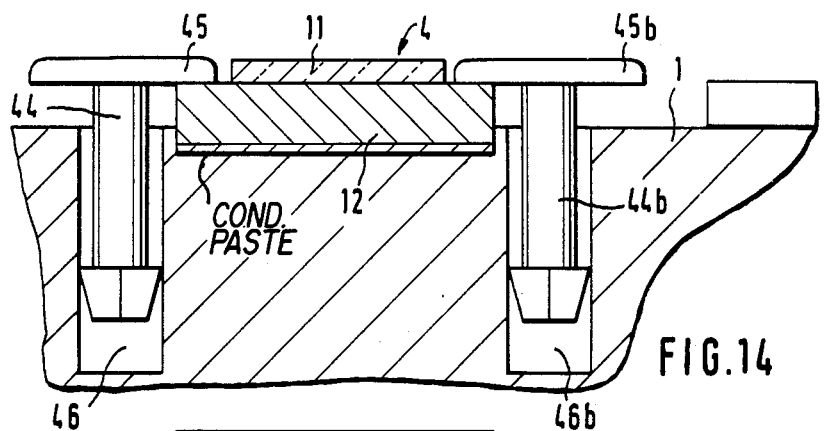
FIG. 14 is a section taken along the line III—III of FIG. 15 through a region of a support plate which is widened as compared with FIG. 12.

The embodiment of FIGS. 4 and 5 shows, as holding part, a spring element 17 which is inserted in the support plate 1 and has two spring arms 18, 19 which point in opposite directions. In this way, one spring arm 18 is able to seat itself on a base 20 of an electronic component 21 and the other spring arm 19 seats on a base 22 of an adjacent electronic component 23. Also shown in FIG. 4 as well as in FIG. 14, is an optional layer of heat-conductive paste disposed between a base 20, 22 (FIG. 4) or base 12 (FIG. 14) and the support plate.

As shown in FIG. 6, the electronic component 4 is detachably held on the support plate 1 by means of a bridge-like pressure piece 24. For this purpose, the pressure piece 24 engages over the chip 11 and rests on the base 12 on both sides of the chip 11. A compression spring 25 which is tensioned between the top of the pressure piece 24 and a beam 26 produces the required application pressure for the pressure piece 24. The beam 26 is detachably fastened to the support plate 1 by conventional means, such as bolts illustrated in FIG. 6, which are located in spaces between adjacent ones of the electronic components 4 and serves as legs for supporting the beam 26 above an electronic component 4. The beam 26 can either span over all the electric components or be developed in each case for one individual component. A catch projection 27 on the support plate 1 serves to locate the electronic component 4.

FIGS. 7 and 8 show within the support plate 1 a trapezoidal trough 28 in which a corresponding trapezoidal base 12 with the chip 11 is inserted. FIG. 7 is split down the middle showing two partial views relating to the insertion of an electronic component 4 with a chip 11 on its base 12. The left side of FIG. 7 shows a free position of the component 4, and the right side of FIG. 4 shows a locked position. This base is held by claws 29, 30, 31 and 32 which engage from the side over the base 12. Lateral recesses 33, 34 in the base 12 make it possible to insert the base 12 into the trough 28, as is shown in the left-hand part of FIG. 7, and then shift the base 12 until the claws 29-32 engage over the base 12, as shown in the right-hand part of FIG. 7, and thereby hold the electronic component 4.

In the embodiment shown in FIGS. 9 and 10, the base 12 is seated in a receiving depression 35. The support plate 1 has fingers cast thereon, for instance fingers 36, 37. It can be noted from FIG. 10 that the finger 36 is mortised so that it leans against the base 12. The other finger 37 is not mortised. In this embodiment of the ivention, the art of mortising creates a tang which is partially split off from the finger 36 and leans against the base 12 to secure it in the depression 35. The tang must be bent back to release the base 12 for removal of the electronic component 4. The finger 36 can no longer be employed to provide the tang for a subsequent installation of the electronic component 4. Since a total of only half of the fingers 36, 37 are mortised, the originally non-mortised fingers 37 are available for mortising and thus for holding the base 12 after the removal and reinstalling of the electronic component 4.

In the embodiment shown in FIG. 11, the base 12 of an electronic component 4 is seated in a centering trough 38 in the support plate 1. The base 12 is held within the centering trough 38 by two clamping plates 39, 40, each of which grips over the base 12 by a bent-off lug 41, 42. These lugs 41, 42 have bottom sides 43 which rise up towards their free end. In this way, the bases 12 are pressed by the lugs 41, 42 into the centering trough 38. Since the clamping plates 39, 40 are to consist of hardened material, the lugs 41, 42 can dig into the bases 12 so that a form-lock is produced.

In accordance with FIGS. 12 and 13, a hardened expansion dowel 44 which has a rim 45 capable of placing itself in mounted condition on the bases 12 of two adjacent electronic components 4 is seated in a hole 46 in the support plate 1. Within the hole 46, the expansion dowel 44 has obliquely downwardly directed dowel claws 48. In this way, a downward-directed tensile force is exerted as soon as the expansion dowel 44 is expanded by means of a mandrel 47 so that the rim 45 seats itself firmly on the bases 12. In addition, the dowel claws 48 press themselves into the wall of the hole 46, thereby securing the claws and dowel in the hole.

Figure 15:
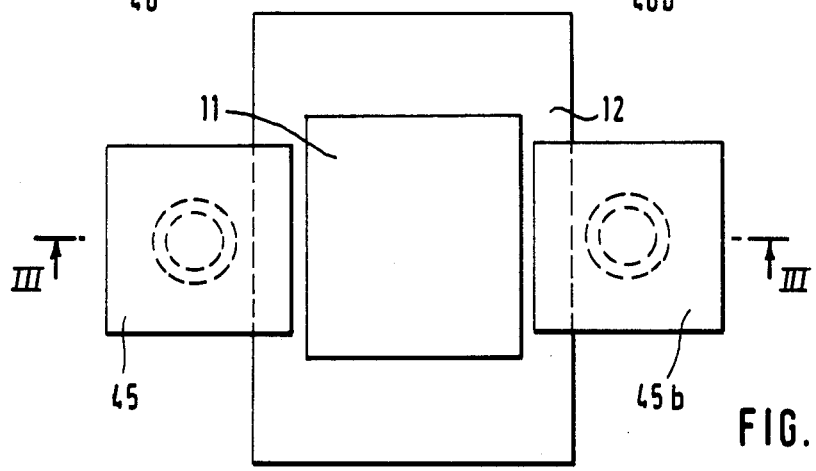
FIG. 15 is a top view of the arrangement of FIG. 14.

FIGS. 14 and 15 show how the rims 45, 45b of two expansion dowels 44, 44b are seated in holes 46, 46b on the base 12 of the electronic component 4 thereby holding it.

Figure 16:
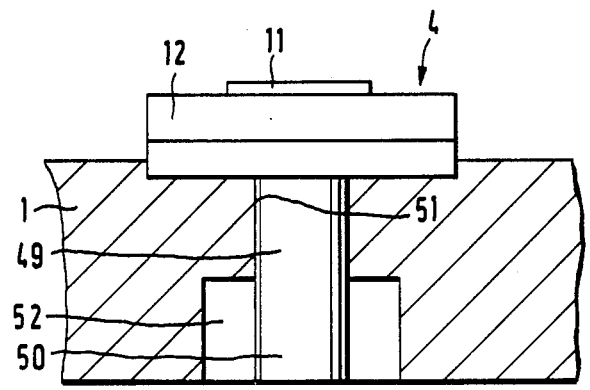
FIG. 16 is a section through another embodiment of a support plate bearing an electronic component.

In the embodiment shown in FIG. 16, the base 12 of the electronic component 4 is developed as a rivet 49 the shank 50 of which is guided through a continuous hole 51 in the support plate 1 so that it can be riveted in a widening 52 on the side of the support plate 1 opposite the chip 11. In order to replace the electronic component 4 the rivet can be drilled out.

Figure 17:
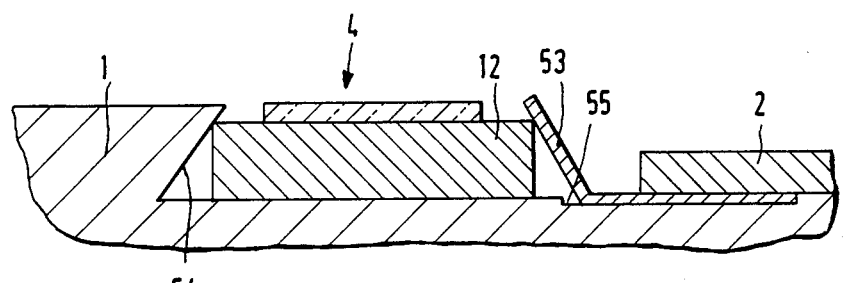
FIG. 17 is a section taken along the line V—V of FIG. 18 through a modified embodiment of a support plate bearing an electronic component.
Figure 18:
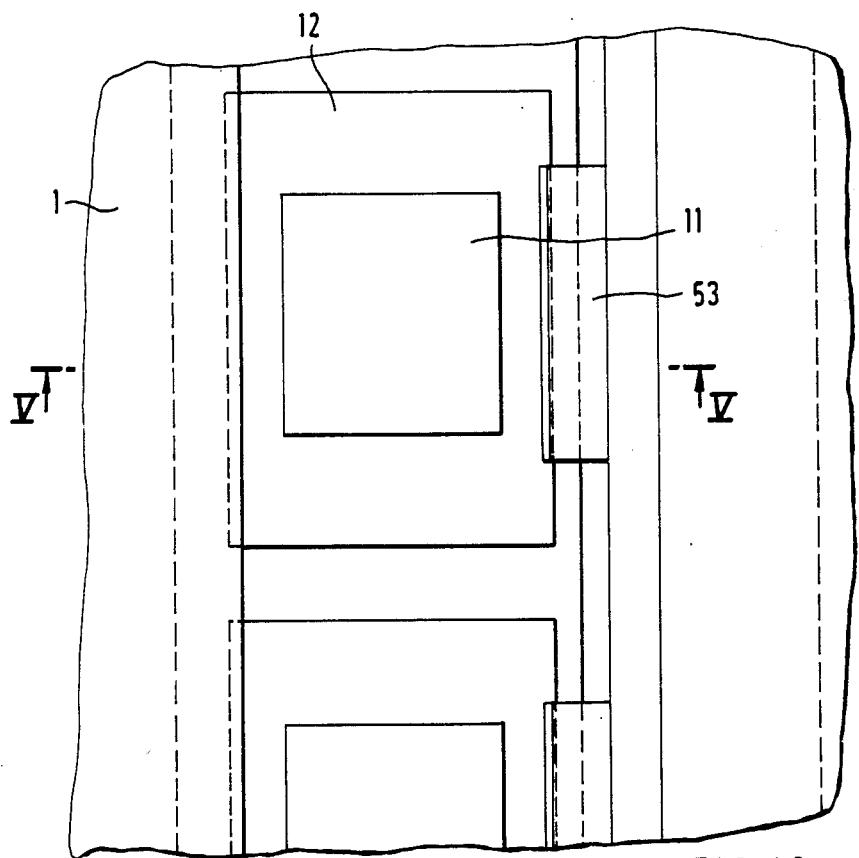
FIG. 18 is a top view of the arrangement of FIG. 17.

FIGS. 17 and 18 shown an electronic component 4 whose base 12 is held by an angle member 53 against an inclined shoulder 54 of the support plate 1. The shoulder 54 is so inclined that its top side protrudes further towards the base 12 than its bottom side. The angle member 53 consists of an arm of resilient material so that it presses the base 12 with initial stress against the shoulder 54. The angle member 53 is held in the manner that it is seated in a recess 55 and is covered on top by the hybrid 2.

We claim:

1. A support plate formed of metal for support of a plurality of electronic components, particularly IC's, each of said components having a metallic base, said plate comprising holding parts adapted for engagement with bases of electronic components, the bases of the electronic components being detachably held on the support plate by said holding parts which engage in part over the bases; and depressions for receiving said electronic components, the bases of the electronic components being insertable in the receiving depressions in the support plate; and wherein the holding parts comprise webs each having at least one bend, the webs extending out of a plane of the support plate to grip by at least one of said bends partly over the bases.

2. A support plate according to claim 1, wherein said receiving depressions are wider than the bases, and that at least one said holding parts is disposed alongside a depression.

3. A support plate formed of metal for support of a plurality of electronic components, particularly IC's, each of said components having a metallic base, said plate comprising holding parts adapted for engagement with bases of electronic components, the bases of the electronic components being detachably held on the support plate by said holding parts which engage in part over the bases; and depressions for receiving said electronic components, the bases of the electronic components being insertable in the receiving depressions in the support plate; and wherein each of the holding parts comprises a spring element, each spring element having a spring arm, each of the spring elements being insertable in the support plate and, upon insertion, extends by means of the spring arm, resiliently, in part over at least one base.

4. A support plate according to claim 3,
wherein each of said spring elements terminating in a plurality of spring arms which point in opposite directions for holding, in each case, two of said bases.

5. A support plate according to claim 3, wherein
a heat-conductive paste is provided between the support plate and the bases of the electronic components.

6. A support plate formed of metal for support of a plurality of electronic components, particularly IC's, each of said components having a metallic base, said plate comprising holding parts adapted for engagement with bases of electronic components, the bases of the electronic components being detachably held on the support plate by said holding parts which engage in part over the bases; and wherein said electronic components include a chip supported by a base, and wherein one of the holding parts is a bridge-shaped pressure piece gripping over said chip and seating on the base on both sides of the chip, there being a cross-member which is detachably fastened to said support plate laterally of at least one electronic component, and a compression spring disposed between and pushing against said pressure piece and said cross-member.

7. A support plate according to claim 6, wherein a base has a catch projection for locating one of the electronic components.

8. A support plate formed of metal for support of a plurality of electronic components, particularly IC's, each of said components having a metallic base, said plate comprising holding parts adapted for engagement with bases of electronic components, the bases of the electronic components being detachably held on the support plate by said holding parts which engage in part over the bases; and the holding parts comprise a sidewall, and for each electronic component, the support plate has a trough, said sidewall being located alongside said trough, said trough is longer than the electronic component and engages on a side of the electronic component by means of a lip of the trough over the base, the trough lip being separated to define claws, and that for the insertion of an electronic component into a trough the base has recesses.

9. A support plate formed of metal for support of a plurality of electronic components, particularly IC's, each of said components having a metallic base, said plate comprising holding parts adapted for engagement with bases of electronic components, the bases of the electronic components being detachably held on the support plate by said holding parts which engage the bases; and depressions for receiving said electronic components, the bases of the electronic components being insertable in the receiving depressions in the support plate; and wherein each base is seated in a receiving depression, there being fingers disposed along an edge of a receiving depression for holding a base, each base being held in a depression by deflection of individual ones of the fingers after insertion of the base.

10. A support plate according to claim 9, wherein
only a part of the fingers is deflected for the holding of a base.

11. A support plate formed of metal for support of a plurality of electronic components, particularly IC's, each of said components having a metallic base, said plate comprising holding parts adapted for engagement with bases of electronic components, the bases of the electronic components being detachably held on the support plate by said holding parts which engage in part over the bases; and the support plate has a separate centering trough for each electronic component, the holding parts being clamping plates each of which has a lug, bent over the base, the clamping plates being disposed laterally of a base on the support plate.

12. A support plate according to claim 11, wherein
each of the lugs has an obliquely extending bottom which rises towards a free end of the lugs.

13. A support plate according to claim 11, wherein
a plurality of clamping plates are necessary for holding a base.

14. A support plate formed of metal for support of a plurality of electronic components, particularly IC's, each of said components having a metallic base, said plate comprising holding parts adapted for engagement with bases of electronic components, the bases of the electronic components being detachably held on the support plate by said holding parts which engage in part over the bases; and each holding part is an expansion dowel seated in a hole in the support plate, said dowel having a rim by which the dowel grips over two adjacent bases.

15. A support plate according to claim 14, wherein each expansion dowel has obliquely downwardly-directed dowel claws disposed within the hole.

16. A support system having a plate formed of metal for support of a plurality of electronic components, particularly IC's, each of said components having a metallic base formed as a rivet with a shank, said rivet serving as a holding part; and a depression for receiving said holding part, wherein each said shank is passed through a continuous hole in the support plate and is riveted on a side of the support plate opposite the electronic component.

17. A support plate formed of metal for support of a plurality of electronic components, particularly IC's, each of said components having a metallic base, said plate comprising holding parts adapted for engagement with bases of electronic components, the bases of the electronic components being detachably held on the support plate by said holding parts which engage in part over the bases, and the support plate has a shoulder; and wherein the holding parts are resilient angle elements each having an arm and which, via the arm resting obliquely against a base, press the base against said shoulder of the support plate.

18. A support plate according to claim 17, wherein the shoulder protrudes towards the top of the base.

* * * * *